United States Patent [19]
Dietrich et al.

[11] Patent Number: 5,221,860
[45] Date of Patent: Jun. 22, 1993

[54] HIGH SPEED LASER PACKAGE

[75] Inventors: Norman R. Dietrich, Allentown; Palmer D. Smeltz, Jr., Ruscombmanor, both of Pa.

[73] Assignee: AT&T Bell Laboratories, Murray Hill, N.J.

[21] Appl. No.: 657,019

[22] Filed: Feb. 19, 1991

[51] Int. Cl.$^5$ .............. G02B 6/42; H01L 23/12
[52] U.S. Cl. ................. 257/678; 333/239; 257/698; 257/728; 257/659
[58] Field of Search ................ 357/74, 80, 81

[56] References Cited

U.S. PATENT DOCUMENTS

| | | | |
|---|---|---|---|
| 4,267,531 | 5/1981 | Spinner et al. | 333/22 |
| 4,309,717 | 1/1982 | Cardinal | 357/74 |
| 4,672,151 | 6/1987 | Yamamura | 357/74 |
| 4,873,566 | 10/1989 | Hokanson et al. | 357/74 |
| 4,879,588 | 11/1989 | Ohtsuka et al. | 357/68 |
| 4,922,325 | 5/1990 | Smeltz, Jr. | 357/74 |
| 4,930,857 | 6/1990 | Acarlar | 357/74 |
| 4,942,076 | 7/1990 | Panicker et al. | 428/137 |
| 4,992,762 | 2/1991 | Godshalt et al. | 333/239 |

FOREIGN PATENT DOCUMENTS

| | | |
|---|---|---|
| 59-155157 | 9/1984 | Japan. |
| 62-128549 | 6/1987 | Japan. |
| 1-91443 | 4/1989 | Japan. |

Primary Examiner—Eugene R. LaRoche
Assistant Examiner—Viet Q. Nguyen
Attorney, Agent, or Firm—Wendy W. Koba

[57] ABSTRACT

An optical package for use with a laser diode in high speed applications. The package comprises a metallic housing with a multilayer ceramic (MLC) insert disposed through a sidewall thereof. The MLC insert is utilized to form a microstrip transmission line of a bandwidth sufficient to couple a high frequency signal source to the laser. A number of conductive vias are disposed through the thickness of the MLC insert at the package wall to serve as electric field shorts within the insert and improve the frequency response of the microstrip. A pair of such MLC inserts may be disposed through opposing sidewalls of the package and used to provide a conventional "butterfly" configuration, while preserving the integrity of the microstrip interconnection.

8 Claims, 3 Drawing Sheets

HIGH SPEED LASER PACKAGE

BACKGROUND OF THE INVENTION

1. Technical Field

The present invention relates to a high speed laser package and, more particularly, to a package which utilizes a hybrid metallic-ceramic arrangement to provide a laser connection with the bandwidth required for high speed operation.

2. Description of the Prior Art

In the field of lightwave communications, there is a constant demand to increase the speed at which laser-based transmitters operate. Less than five years ago, most transmitters operated at speeds of approximately 560 Mb/s. In the past few years, the speed has continued to increase to 880 Mb/s, 1 Gb/s and beyond. The push to multi-gigabit operation has stressed the performance of conventional laser packaging. In particular, problems are created in coupling the input data signal to the laser, since conventional electrical contacts develop an extremely large parasitic series inductance. As is well-known in the art, the inductance functions to decrease the bandwidth of the connection and limits the data rate of the signal applied thereto. Analog, as well as digital applications exist where it is desired to provide a multi-GHz, high frequency interconnection. In general, the multi-gigabit and multi-GHz applications will be referred to hereinafter as "high speed" applications. Borrowing from microwave technology, a coaxial connection may be utilized in place of the conventional electrical connection to reduce the parasitic inductance. U.S. Pat. No. 4,309,717, issued Jan. 5, 1982, discloses one such coaxial input arrangement. As disclosed, a conventional coaxial line is inserted through a standard metal laser package, hermetically sealed in place, and connected to the laser. Although this arrangement solves the problem associated with standard electrical connections at high speeds, the package itself is bulky, expensive and relatively difficult to manufacture.

An improved laser packaging arrangement which advantageously utilizes a multilayer ceramic (MLC) structure to provide the interconnection between the signal source and the laser is disclosed in U.S. Pat. No. 4,873,566, issued on Oct. 10, 1989. In this arrangement, a multilayer microwave transmission line, formed within the wall of a ceramic package, is utilize to provide the high speed interconnection. Such a package is capable of using any set of leads to form the transmission line and, indeed, more than one transmission line may be formed as part of a single package. The use of such a ceramic package including a microwave transmission structure has been found to allow operation at data rates in excess of 1 Gb/s. However, many transmitter and/or system designs require the use of the more conventional metallic package design (in particular, its common "butterfly" configuration—the term "butterfly" referring to an arrangement where the leads exit symmetrically through the package sidewalls).

Therefore, a need remains in the art for a means of providing a connection between a signal source and a packaged laser which provides the bandwidth required to support high speed operation, while remaining compatible with existing packaging and applications technology.

SUMMARY OF THE INVENTION

The need remaining in the prior art is addressed by the present invention which relates to a high speed laser package and, more particularly, to a package which utilizes a hybrid metallic-ceramic arrangement.

In accordance with one embodiment of the present invention, a metallic package body is adapted to include a multilayer ceramic (MLC) insert disposed through a sidewall thereof, the MLC insert used to provide a microstrip transmission line interconnection between an external signal source and the laser diode. We have discovered that the combination of a microstrip transmission line with a metallic surrounding member (i.e., package wall) results in forming a resonant cavity which, when energized, degrades the coupling of the signal source to the laser at the resonant frequency of the cavity's equivalent circuit. Therefore, an exemplary embodiment of a package according to this invention further comprises at least one (preferably more than one) shorting means (i.e., conductive via) formed through the thickness of the MLC insert and coupled at either end to the metallic package wall. The via(s) serve as boundaries for the resonant electric field and function to substantially increase the resonant frequency of the equivalent circuit well beyond the desired bandwidth of the laser package.

It is an advantage of the structure of the present invention that the MLC insert, including the shorting via(s), may be routinely metallized and brazed to the metallic package wall so as to form a hermetic package structure.

Another advantage of the arrangement of the present invention is that a pair of MLC inserts may be included in the package, disposed on opposite package walls, so as to form a "butterfly" package structure which is compatible with conventional application requirements.

Further, the shorting via(s) may be formed from a tungsten paste which is forced into the ceramic material before firing, utilizing a conventional and relatively simple process, thus providing an economical and efficient means of increasing the bandwidth of the inventive laser package.

Other and further advantages of the present invention will become apparent during the course of the following discussion and by reference to the accompanying drawings.

BRIEF DESCRIPTION OF THE DRAWING

Referring now to the drawings, where like numerals represent like parts in several views.

DETAILED DESCRIPTION

Figure 1:
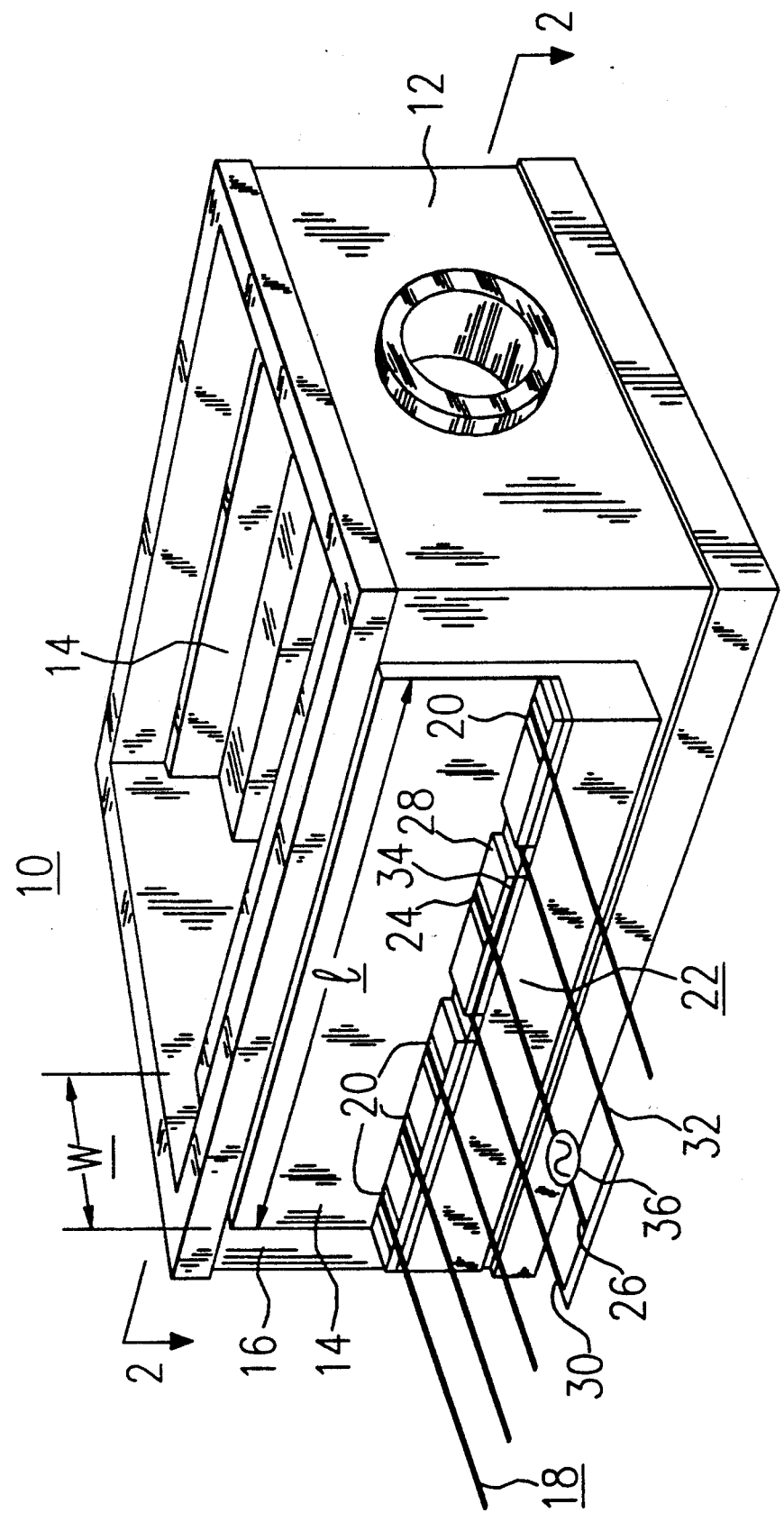
FIG. 1 illustrates an exemplary laser package formed in accordance with the teachings of the present invention, including a multilayer ceramic (MLC) insert for providing a microstrip interconnection between an external high frequency signal source and an internal laser.

FIG. 1 illustrates an exemplary laser-based optical package 10 formed in accordance with the present invention including a metallic package shell 12 and a multilayer ceramic (MLC) insert 14 disposed as shown through sidewall 16 of package 10. Package shell 12 may be formed of Kovar ® (trade name for a combination of iron, nickel and cobalt) or any other suitable metallic material which may be processed to form a hermetic package. MLC insert 14 may comprise a laminated structure, formed of separate sheets of a dielectric material (e.g., alumina), which is fired to form the final structure. A plurality of leads 18 are illustrated as being bonded to a like number of separate metallic feedthroughs 20 formed at various locations within the structure of MLC insert 14. Advantageously, as mentioned above, the hybrid metallic-ceramic package of the present invention may be formed to include a pair of MLC inserts 14, disposed through both sidewalls of the package, with each insert carrying a number of feedthroughs (e.g., seven) such that a conventional "butterfly" configuration (e.g., 14-pin) may be formed.

As shown in FIG. 1, MLC insert 14 includes a microstrip interconnect 22 comprising a first (positive) connection 24 and a second (ground) connection 26, first connection 24 separated from second connection 26 by at least one ceramic layer 28. Second connection 26 is shown as including in detail a first lead 30, a second lead 32 and a metallic member 34, metallic member 34 being disposed underneath both first lead 30 and second lead 32. In particular, metallic member 34 is formed to extend through the complete width w of insert 14 in the vicinity of leads 30,32. The performance of a structure such as microstrip 22 is described in detail in U.S. Pat. No. 4,873,566 referred to above and is herein incorporated by reference. In general, microstrip 22 is utilized to provide a high frequency interconnection between an external signal source 36 and a laser diode (not shown) located within package 10.

It has been discovered that the combination of insert 14 (including microstrip 22) with surrounding package wall 16 forms a resonant circuit which, when energized with a signal from external source 36, creates an electric field at a particular frequency with a half-wavelength variation along the length l of insert 14, where the equivalent circuit will resonate, resulting in the circulation of currents around package wall 16. The presence of this resonance serves to direct the energy from external source 36 into the metallic package structure, thus diverting this energy away from the coupled laser. Therefore, at a resonant frequency, the laser will suffer a significant drop in light output. It is to be understood that several such resonant frequencies may exist as a result of the physical design of the package and the resultant combination of various parasitic inductive and capacitive components included therein.

Figure 2:
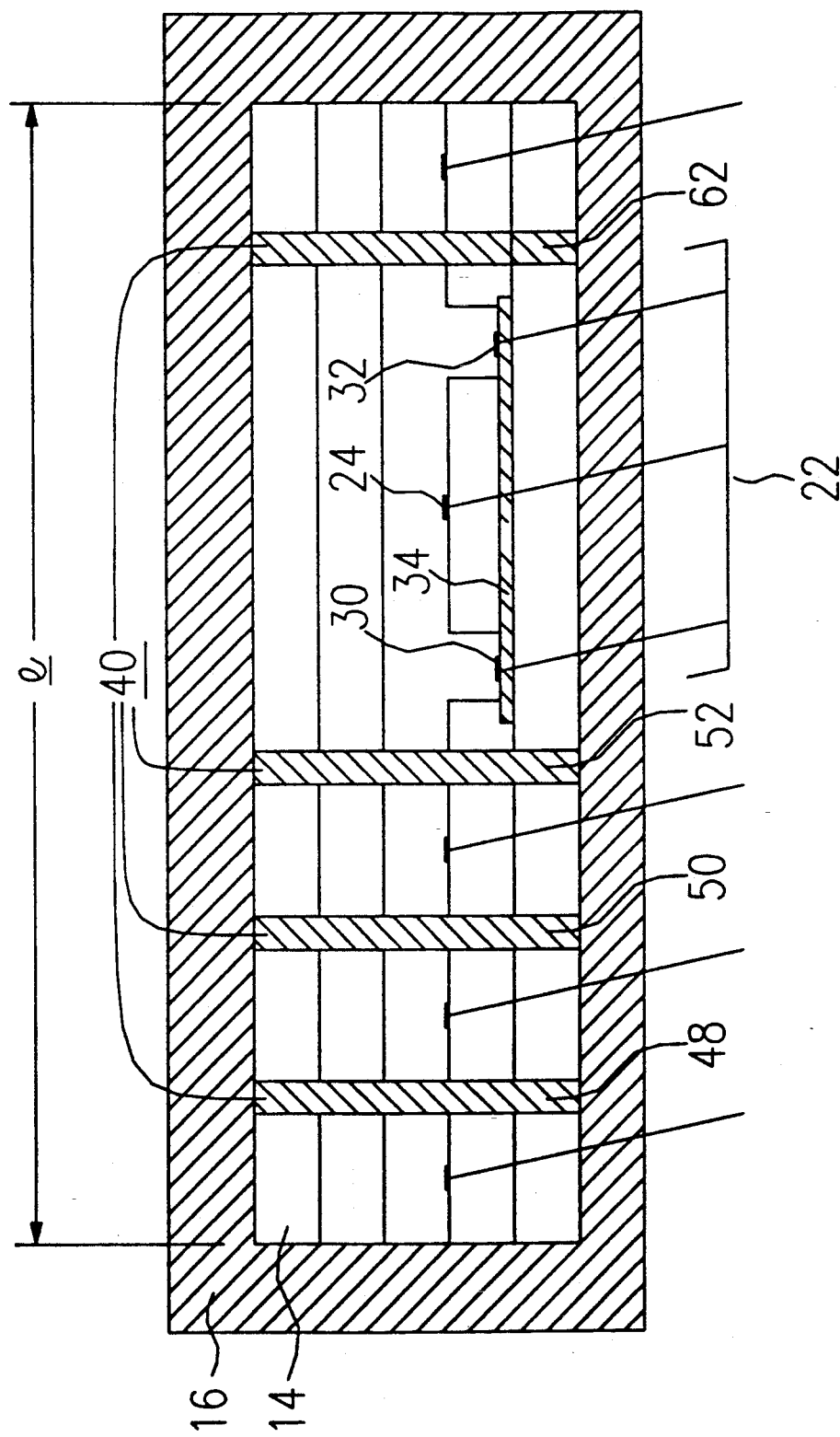
FIG. 2 illustrates a cut-away view in perspective of the sidewall of the package of FIG. 1, illustrating in particular the location of an exemplary MLC insert and a plurality of shorting vias utilized to minimize the effects of the resonant circuit created therein.

In order to overcome the problems related to the presence of the resonant circuit, MLC insert 14 of the inventive package includes at least one (preferably, several) shorting member(s) 40 (i.e., vias) which are positioned along the length l of insert 14. FIG. 2 illustrates a cut-away side view of package 10 of FIG. 1 illustrating in particular the inclusion of a plurality of shorting vias 40 along the length l of insert 14. In accordance with the teachings of the present invention, shorting vias 40 function as terminations for the electric field, changing its periodicity along length l so as to increase the frequency of the resonance. In particular, a sufficient number of vias are utilized such that the frequency of the resonance is shifted beyond the bandwidth required for the operation of microstrip 22. Therefore, signals from external source 36 in the GHz range will pass through microstrip 22 and be coupled to the laser without being diverted to the package equivalent circuit. Thus, the power to the laser will remain representative of the applied input signal over the desired package bandwidth.

Figure 3:
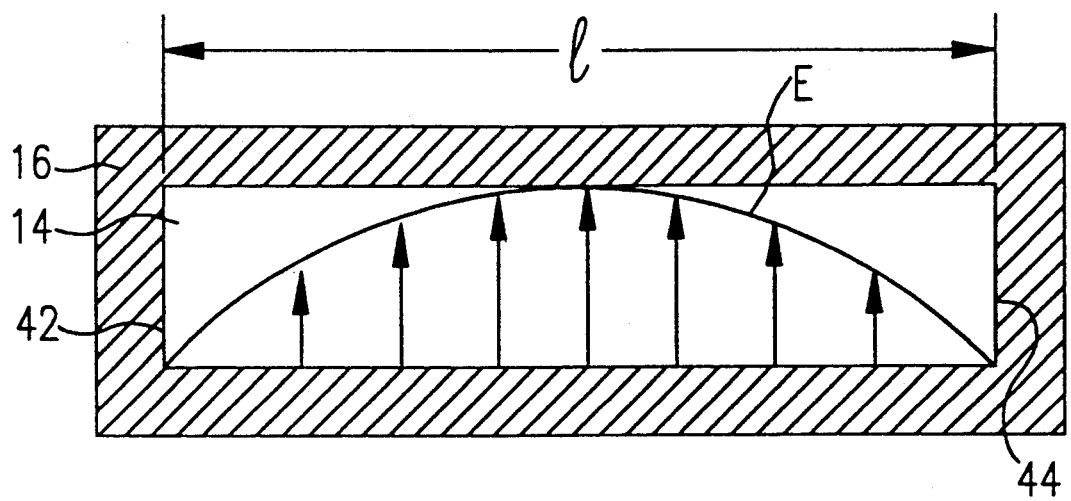
FIGS. 3–5 contain a number of simplified side view perspectives illustrating the effect of the shorting vias on the electric field pattern within the ceramic insert.
Figure 4:
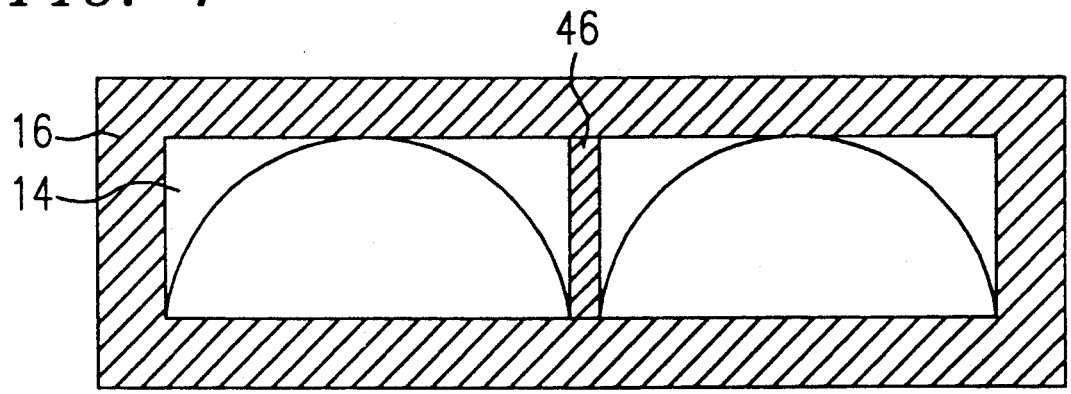
Figure 5:
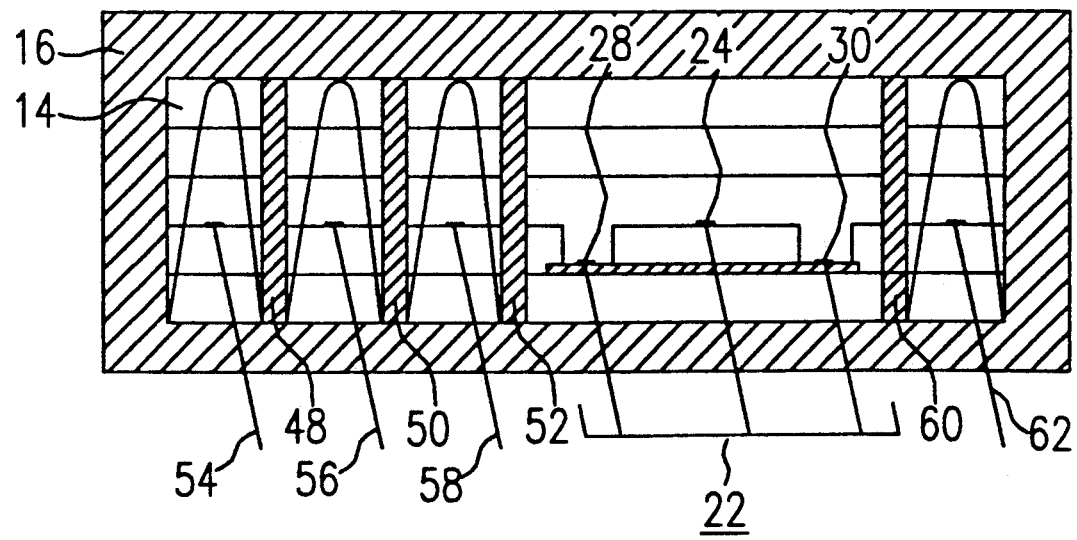

FIGS. 3-5 contains a set of simplified drawings illustrating the operation of shorting vias 40. FIG. 3 illustrates a simplified side view of the arrangement of FIG. 2, showing only ceramic insert 14 and surrounding metallic package wall 16. Without the addition of any vias, an electric field E is created as shown, with boundaries (i.e., locations where the electric field must have zero value) located at ends 42 and 44 of insert 14. Utilizing conventional materials and dimensions required for laser packaging, a resonant circuit may be created which, when energized will produce an electric field (as illustrated) having a frequency of approximately 1.5 GHz, well within the desired bandwidth (e.g., 3-4 GHz) desired for high speed operation. The presence of the resonance at this frequency functions, as discussed above, to significantly reduce the energy applied to the laser; instead diverting the energy to the resonant structure created by the hybrid metallic-ceramic package wall.

The addition of a single shorting via 46, shown in FIG. 4, will thus add one location within insert 14 where the electric field must be at zero value. With the additional of a single electric field boundary, therefore, the resonant frequency of the circuit will be doubled. The doubling may be sufficient for some purposes. In the preferred embodiment of the present invention, a plurality of such shorting vias are utilized, since the additional vias function to triple, quadruple, etc., the resonant frequency of the equivalent circuit well beyond the bandwidth required for most high speed applications.

FIG. 5 illustrates an exemplary arrangement including a set of four shorting vias disposed between various leads of a package such as that illustrated in FIGS. 1 and 2. In particular, a first group of shorting vias 48, 50 and 52 are interleaved with a first set of leads 54, 56 and 58, respectively, so as to form an electric field boundary between each pair of leads. A last shorting via 60 is disposed between microstrip connection 22 and the final lead 62. It is to be noted that for an exemplary application wherein ground plane 34 is maintained at a different potential than the package ground created by wall 16, it would be disadvantageous to include a shorting via within microstrip connection 22. In general, however, additional vias may be included between the leads forming the microstrip connection where the grounding issue is not a problem.

In the fabrication of the metallic-ceramic package of the present invention, the shorting vias may comprise a tungsten material which may be inserted, in paste form, through holes punched in large laminated sheets of the ceramic material prior to firing of the ceramic and the formation of the inserts. The perimeter of the MLC insert which is attached the package wall may be metallized so that the insert may be brazed to the package sidewall and form a hermetic seal.

We claim:

1. An optical package comprising a metallic body including opposing metallic sidewalls;

a multilayer ceramic insert disposed through a metallic sidewall of said metallic body such that a first end of said insert is positioned inside said package and a second, opposite end is positioned outside said package, the multilayer ceramic insert including a microstrip transmission line for coupling, at said first end, to an active optical device and coupling, at said second end, to an external signal source; and shorting means disposed through the thickness of the multilayer ceramic insert and coupled to the metallic body for terminating any electric field present within the package.

2. An optical package as defined in claim 1 wherein the shorting means is positioned separated from the metallic body sidewall.

3. An optical package as defined in claim 1 wherein the shorting means comprises at least one conductive via disposed through the thickness of the multilayer ceramic so as to contact the metallic body.

4. An optical package as defined in claim 3 wherein the at least one conductive via comprises a plurality of conductive vias.

5. An optical package as defined in claim 3 wherein the at least one conductive via comprises tungsten.

6. An optical package as defined in claim 1 wherein the metallic body comprises a combination of nickel, iron and copper.

7. An optical package as defined in claim 1 wherein the multilayer ceramic insert further comprises a metallic layer formed around the perimeter of the insert, wherein the insert is brazed to said metallic sidewall so as to form a hermetic structure.

8. An optical package as defined in claim 1 wherein the package further comprises a second multilayer ceramic insert disposed through an opposing metallic sidewall.

* * * * *